US010480095B2

(12) United States Patent
Halpin et al.

(10) Patent No.: US 10,480,095 B2
(45) Date of Patent: Nov. 19, 2019

(54) SYSTEM FOR RAPID BAKE OF SEMICONDUCTOR SUBSTRATE WITH UPPER LINEAR HEATING ELEMENTS PERPENDICULAR TO HORIZONTAL GAS FLOW

(71) Applicant: ASM America, Inc., Phoenix, AZ (US)

(72) Inventors: Michael W. Halpin, Scottsdale, AZ (US); Paul T. Jacobson, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 66 days.

(21) Appl. No.: 15/874,785

(22) Filed: Jan. 18, 2018

(65) Prior Publication Data

US 2018/0155851 A1 Jun. 7, 2018

Related U.S. Application Data

(62) Division of application No. 13/049,763, filed on Mar. 16, 2011, now Pat. No. 9,885,123.

(51) Int. Cl.
*C30B 31/12* (2006.01)
*C30B 25/16* (2006.01)
(Continued)

(52) U.S. Cl.
CPC .............. *C30B 25/16* (2013.01); *C23C 16/02* (2013.01); *C23C 16/0209* (2013.01); *C30B 25/10* (2013.01); *C30B 29/06* (2013.01)

(58) Field of Classification Search
CPC ......... C30B 25/00; C30B 25/02; C30B 25/10; C30B 25/12; C30B 25/16; C30B 31/00;
(Continued)

(56) References Cited

U.S. PATENT DOCUMENTS

| 1,060,265 A | 4/1913 | Lamb |
| 3,560,252 A | 2/1971 | Kennedy |

(Continued)

FOREIGN PATENT DOCUMENTS

| DE | 44 37 361 A1 | 4/1996 |
| EP | 0339279 A2 | 2/1989 |

(Continued)

OTHER PUBLICATIONS

Wolansky et al., "Low temperature clean for Si/SiGe epitaxy for CMOS integration of heterojunction bipolar transistors," Proceedings of the 8th International Symposium on Silicon Materials Science and Technology, pp. 812-821 (1998).

(Continued)

*Primary Examiner* — Kenneth A Bratland, Jr.
(74) *Attorney, Agent, or Firm* — Knobbe, Martens, Olson & Bear, LLP

(57) ABSTRACT

A system and methods are provided for low temperature, rapid baking to remove impurities from a semiconductor surface prior to in-situ deposition. The system is configured with an upper bank of heat elements perpendicular to the gas flow path, such that when the substrate is heated, the temperature across the substrate can be maintained relatively uniform via zoned heating. Advantageously, a short, low temperature process is suitable for advanced, high density circuits with shallow junctions. Furthermore, throughput is greatly improved by the low temperature bake.

16 Claims, 5 Drawing Sheets

(51) Int. Cl.
  *C30B 25/10* (2006.01)
  *C30B 29/06* (2006.01)
  *C23C 16/02* (2006.01)

(58) Field of Classification Search
  CPC ......... C30B 31/06; C30B 31/12; C30B 31/14;
            C30B 31/10; C30B 33/00; C30B 33/02;
            C30B 29/00; C30B 29/02; C30B 29/06;
            C23C 16/00; C23C 16/02; C23C 16/0209;
            Y10T 117/00; Y10T 117/10; Y10T
            117/1016
  USPC .......... 117/84–86, 88–90, 94, 105–106, 200,
            117/204, 928, 935–936; 118/715, 722,
            118/724–725, 728
  See application file for complete search history.

(56) References Cited

U.S. PATENT DOCUMENTS

| | | |
|---|---|---|
| 3,615,931 A | 10/1971 | Arthur, Jr. et al. |
| 3,641,974 A | 2/1972 | Yamada et al. |
| 3,796,099 A | 3/1974 | Shimotsuma et al. |
| 3,969,943 A | 7/1976 | Ohno et al. |
| 4,001,586 A | 1/1977 | Fraioli |
| 4,210,925 A | 7/1980 | Morcom et al. |
| 4,422,407 A | 12/1983 | Bessot et al. |
| 4,435,092 A | 3/1984 | Iuchi |
| 4,446,817 A | 5/1984 | Crawley |
| 4,456,919 A | 6/1984 | Tomita et al. |
| 4,496,609 A | 1/1985 | McNeilly et al. |
| 4,558,660 A | 12/1985 | Nishizawa et al. |
| 4,563,367 A | 1/1986 | Sherman |
| 4,564,416 A | 1/1986 | Homma et al. |
| 4,607,591 A | 8/1986 | Stitz |
| 4,615,294 A | 10/1986 | Scapple et al. |
| 4,698,486 A | 10/1987 | Sheets |
| 4,728,389 A | 3/1988 | Logar |
| 4,728,777 A | 3/1988 | Tsisios et al. |
| 4,749,440 A | 6/1988 | Blackwood et al. |
| 4,764,026 A | 8/1988 | Powell et al. |
| 4,789,771 A | 12/1988 | Robinson et al. |
| 4,798,165 A | 1/1989 | Deboer et al. |
| 4,821,674 A | 4/1989 | Deboer et al. |
| 4,828,224 A | 5/1989 | Crabb et al. |
| 4,836,138 A * | 6/1989 | Robinson .............. C23C 16/481 118/500 |
| 4,854,727 A | 8/1989 | Pecot et al. |
| 4,870,030 A | 9/1989 | Markunas et al. |
| 4,890,245 A | 12/1989 | Yomoto et al. |
| 4,913,790 A | 4/1990 | Narita et al. |
| 4,919,542 A | 4/1990 | Nulman et al. |
| 4,969,748 A | 11/1990 | Crowley et al. |
| 4,975,561 A | 12/1990 | Robinson et al. |
| 4,978,567 A | 12/1990 | Miller |
| 4,984,902 A | 1/1991 | Crowley et al. |
| 4,996,942 A | 3/1991 | Deboer et al. |
| 5,002,630 A | 3/1991 | Kermani et al. |
| 5,011,789 A | 4/1991 | Burns |
| 5,028,973 A | 7/1991 | Bajor |
| 5,063,031 A | 11/1991 | Sato |
| 5,098,198 A | 3/1992 | Nulman et al. |
| 5,108,792 A | 4/1992 | Anderson et al. |
| 5,129,958 A | 7/1992 | Nagashima et al. |
| 5,144,376 A | 9/1992 | Kweon |
| 5,156,461 A | 10/1992 | Moslehi et al. |
| 5,158,644 A | 10/1992 | Cheung et al. |
| 5,205,871 A | 4/1993 | Godbey et al. |
| 5,211,796 A | 5/1993 | Hansen |
| 5,221,412 A | 6/1993 | Kagata et al. |
| 5,225,245 A | 7/1993 | Ohta et al. |
| 5,252,841 A | 10/1993 | Wen et al. |
| 5,285,089 A | 2/1994 | Das |
| 5,319,220 A | 6/1994 | Suzuki et al. |
| 5,323,032 A | 6/1994 | Sato et al. |
| 5,326,992 A | 7/1994 | Yoder |
| 5,332,442 A | 7/1994 | Kubodera et al. |
| 5,359,693 A | 10/1994 | Nenyei et al. |
| 5,373,806 A | 12/1994 | Logar |
| 5,377,126 A | 12/1994 | Flik et al. |
| 5,378,901 A | 1/1995 | Nii |
| 5,403,434 A | 4/1995 | Moslehi |
| 5,421,957 A | 6/1995 | Carlson et al. |
| 5,422,502 A | 6/1995 | Kovacic |
| 5,425,842 A | 6/1995 | Zijlstra |
| 5,445,675 A | 8/1995 | Kubodera et al. |
| 5,446,825 A | 8/1995 | Moslehi et al. |
| 5,470,799 A | 11/1995 | Itoh et al. |
| 5,471,947 A | 12/1995 | Southworth et al. |
| 5,496,745 A | 3/1996 | Ryum et al. |
| 5,508,536 A | 4/1996 | Twynam et al. |
| 5,512,772 A | 4/1996 | Maeda et al. |
| 5,514,439 A | 5/1996 | Sibley |
| 5,517,943 A | 5/1996 | Takahashi |
| 5,549,756 A | 8/1996 | Sorensen et al. |
| 5,557,117 A | 9/1996 | Matsuoka et al. |
| 5,557,118 A | 9/1996 | Hashimoto |
| 5,578,521 A | 11/1996 | Suzuki et al. |
| 5,587,019 A | 12/1996 | Fujie |
| 5,593,608 A | 1/1997 | Suzuki |
| 5,609,721 A | 3/1997 | Tsukune et al. |
| 5,650,082 A | 7/1997 | Anderson |
| 5,670,801 A | 9/1997 | Nakano |
| 5,678,989 A | 10/1997 | Okase |
| 5,693,147 A | 12/1997 | Ward et al. |
| 5,707,146 A | 1/1998 | Gaus et al. |
| 5,729,033 A | 3/1998 | Hafizi |
| 5,743,644 A | 4/1998 | Kobayashi et al. |
| 5,783,495 A | 7/1998 | Li et al. |
| 5,809,211 A | 9/1998 | Anderson et al. |
| 5,859,447 A | 1/1999 | Yang et al. |
| 5,899,752 A | 5/1999 | Hey et al. |
| 5,926,743 A | 7/1999 | Xi et al. |
| 5,968,587 A | 10/1999 | Frankel |
| 5,986,287 A | 11/1999 | Eberl et al. |
| 5,998,305 A | 12/1999 | Holmer et al. |
| 6,027,602 A | 2/2000 | Hung et al. |
| 6,031,255 A | 2/2000 | Delage et al. |
| 6,043,519 A | 3/2000 | Shealy et al. |
| 6,049,098 A | 4/2000 | Sato |
| 6,058,945 A | 5/2000 | Fujiyama et al. |
| 6,060,397 A | 5/2000 | Seamons et al. |
| 6,074,478 A | 6/2000 | Oguro |
| 6,093,252 A | 7/2000 | Wengert et al. |
| 6,121,061 A | 9/2000 | Van Bilsen et al. |
| 6,133,152 A | 10/2000 | Bierman et al. |
| 6,164,295 A | 12/2000 | Ui et al. |
| 6,167,195 A | 12/2000 | Moslehi |
| 6,190,453 B1 | 2/2001 | Boydston et al. |
| 6,210,484 B1 | 4/2001 | Hathaway |
| 6,221,168 B1 | 4/2001 | Carter et al. |
| 6,259,061 B1 | 7/2001 | Osawa |
| 6,265,323 B1 | 7/2001 | Makamura et al. |
| 6,281,141 B1 | 8/2001 | Das et al. |
| 6,288,367 B1 | 9/2001 | Robinson et al. |
| 6,316,747 B1 | 11/2001 | Blersch et al. |
| 6,316,795 B1 | 11/2001 | Croke, III |
| 6,319,556 B1 | 11/2001 | Olsen et al. |
| 6,391,796 B1 | 5/2002 | Akiyama et al. |
| 6,448,536 B2 | 9/2002 | Li et al. |
| 6,454,854 B1 | 9/2002 | Ose |
| 6,465,761 B2 | 10/2002 | Stevens et al. |
| 6,554,905 B1 | 4/2003 | Goodwin |
| 6,566,279 B2 | 5/2003 | Suemitsu et al. |
| 6,593,211 B2 | 7/2003 | Sato |
| 6,709,267 B1 | 3/2004 | Hawkins et al. |
| 6,818,864 B2 | 11/2004 | Ptak |
| 6,856,078 B2 | 2/2005 | Halpin |
| 6,861,321 B2 | 3/2005 | Keeton et al. |
| 6,876,816 B2 | 4/2005 | Shigeoka et al. |
| 6,891,131 B2 | 5/2005 | Sakuma et al. |
| 7,108,748 B2 | 9/2006 | Brabant et al. |
| 2003/0036268 A1 | 2/2003 | Brabant et al. |

(56) References Cited

U.S. PATENT DOCUMENTS

| | | |
|---|---|---|
| 2005/0092242 A1 | 5/2005 | Wood |
| 2009/0101633 A1 | 4/2009 | Aggarwal et al. |
| 2011/0033610 A1* | 2/2011 | Bertram, Jr. ............ C23C 16/44 427/8 |

FOREIGN PATENT DOCUMENTS

| | | |
|---|---|---|
| EP | 0445596 A2 | 11/1991 |
| EP | 0634785 A1 | 1/1995 |
| EP | 0829784 A1 | 3/1998 |
| FR | 2629912 A1 | 10/1989 |
| JP | 1-114727 A | 5/1989 |
| JP | 7-58039 A | 3/1995 |
| JP | 08-045863 A | 2/1996 |
| JP | 09-036046 A | 2/1997 |
| JP | 11-135449 A | 5/1999 |
| WO | WO 99/45573 A2 | 9/1999 |
| WO | WO 2010/005620 A2 | 1/2010 |
| WO | WO-2010005620 A2 * | 1/2010 ............ C23C 16/44 |

OTHER PUBLICATIONS

Wolf et al., "Silicon epitaxial growth and silicon on insulator", Chapter 7 in Silicon Processinig for the VLSI Era, vol. 1: process technology, 2nd Ed., 2000, pp. 225-264.

Wolf et al., "Silicon Processing for the VLSI Era", Lattice Press, 1986, vol. 1: Processing Tech., pp. 140-1142, 155-156, Sunset Beach, CA, USA.

\* cited by examiner

SYSTEM FOR RAPID BAKE OF SEMICONDUCTOR SUBSTRATE WITH UPPER LINEAR HEATING ELEMENTS PERPENDICULAR TO HORIZONTAL GAS FLOW

CROSS-REFERENCE TO RELATED APPLICATIONS

This application is a division of and claims the benefit of priority under 35 U.S.C. § 120 from U.S. application Ser. No. 13/049,763, filed Mar. 16, 2011, titled "RAPID BAKE OF SEMICONDUCTOR SUBSTRATE WITH UPPER LINEAR HEATING ELEMENTS PERPENDICULAR TO HORIZONTAL GAS FLOW" the entire contents of each of which is incorporated herein by reference.

BACKGROUND OF THE INVENTION

Field of the Invention

The present invention relates to cleaning semiconductor substrates prior to forming layers thereupon, and more particularly to bake steps and subsequent in-situ epitaxial deposition within a single-substrate chemical vapor deposition (CVD) or atomic layer deposition (ALD) chamber.

Description of the Related Art

High-temperature ovens, called reactors, are used to create structures of very fine dimensions, such as integrated circuits on semiconductor substrates. One or more substrates, such as silicon substrates (which may or may not include previously formed structures thereon or therein), are placed on a substrate support inside the reaction chamber. Both the substrate and support are heated to a desired temperature. In a typical substrate treatment step, reactant gases are passed over the heated substrate, causing the chemical vapor deposition (CVD) of a thin layer of the reactant material on the substrate. Various process conditions, particularly temperature uniformity and reactant gas distribution, must be carefully controlled to ensure the high quality of the resulting layers.

Through a series of deposition, doping, photolithography and etch steps, the starting substrate and the subsequent layers are converted into integrated circuits, with a single layer producing from tens to thousands or even millions of integrated devices, depending on the size of the substrate and the complexity of the circuits.

Batch processors have traditionally been employed in the semiconductor industry to allow multiple substrates to be processed simultaneously, thus economically presenting low processing times and costs per substrate. Recent advances in miniaturization and attendant circuit density, however, have lowered tolerances for imperfections in semiconductor processing. Accordingly, single substrate processing reactors have been developed for improved control of deposition conditions.

Among other process parameters, single substrate processing has greatly improved temperature and gas flow distribution across the substrate. In exchange for greater process control, however, processing time has become even more critical than with batch systems. Every second added to processing times must be multiplied by the number of substrates being processed serially, one at a time, through the same single-substrate processing chamber. Conversely, any improvements in substrate throughput can translate to significant fabrication cost savings.

One process for which process control is particularly critical, and for which single substrate processing is particularly useful, is the formation of epitaxial layers. If the deposited layer has the same crystallographic structure as the underlying silicon substrate, it is called an epitaxial layer. Through careful control of deposition conditions, reactant gases are passed over a heated substrate such that the deposited species precipitates in conformity with the underlying crystal structure, which is thus extended into the growing layer. The lowest level of devices, including transistors, often include epitaxial layers formed over a single crystal semiconductor substrate.

It is important that the epitaxial layers maintain a pure crystal structure, free of contamination which could affect device operation. The purity and crystalline structure of the underlying substrate prior to epitaxial deposition strongly affects the resultant epitaxial layer. Contaminants at the substrate surface, such as naturally forming "native oxide" and carbon contaminants, interfere with the crystal structure and consequent electrical properties of each overlying layer as it is formed, resulting in a polycrystalline layer. Note that clean, oxide-free surfaces are also desirable for a number of contexts other than epitaxial deposition.

Substrates are typically cleaned prior to deposition with an ammonium hydroxide, hydrogen peroxide mixture, known as an "APM" clean. The most popular cleaning methods involve one or more forms of an RCA cleaning procedure, the basic procedure developed by the Radio Corporation of America in the 1960s. The RCA Standard-Clean-1 (SC-1) procedure uses an APM solution and water heated to a temperature of about 70° C. The SC-1 procedure dissolves films and removes Group I and II metals. The Group I and II metals are removed through complexing with the reagents in the SC-1 solution. The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure.

If an oxide-free surface is required, as in the case of epitaxial stacks, the silicon substrate is typically dipped into an aqueous solution of hydrofluoric acid or HF vapor treated to etch away the oxide layer left by an APM clean and, theoretically, obtain hydrogen termination. There are a large number of variations on RCA clean and hydrofluoric acid treatments. After cleaning, substrates are typically stored for a period of time before further processing. A native oxide tends to form on the previously oxide-free silicon substrate surface almost immediately after exposure to air or moisture. Further, silicon-fluorine and silicon-carbon bonds are often observed on the silicon substrate surface after cleaning. The fluorine and carbon contamination on the surface can be detrimental to the thermal budget and/or the quality of the layer to be grown or deposited on the surface of the substrate.

If the silicon substrate is dipped in hydrofluoric acid as the last cleaning step (also known as an "HF last" step), the surface of the silicon is typically terminated mostly with a monolayer of hydrogen, attached to the substrate largely through Si—H bonds. The hydrogen-terminated surface resists oxidation more than untreated silicon. If desired, the hydrogen termination can be removed at temperatures greater than about 500° C. However, the surface of a silicon substrate after a conventional HF last treatment normally starts to reoxidize within about 20 minutes after the original oxide layer was removed, quickly forming a new 5 Å to 7

Å thick oxide layer on the surface of the silicon substrate. Carbon or fluorine termination can better prevent re-oxidation, though this will introduce other problems, such as contamination or difficulty in removing the termination prior to subsequent processing. The problem of reoxidation after the HF last step has been detrimental to the high-throughput manufacturing of many silicon devices.

One method is known in the art for a low temperature bake step with a relatively short duration with more power provided to the upper lamps for a short period of time. The lower temperature bake step can remove the protective hydrogen termination formed after the HF last step while consuming less of the thermal budget.

SUMMARY OF THE INVENTION

A need exists, therefore, for improved methods of purifying substrate surfaces prior to vapor deposition, maintaining temperature uniformity of the substrate during processing steps, and maintaining the purity of a deposited layer after formation. Desirably, such methods should be compatible with single-substrate deposition chambers without increasing system costs or reducing substrate throughput. These and other needs are satisfied by several embodiments of the present invention.

In accordance with one embodiment, methods of treating a semiconductor substrate having an exposed semiconductor region are provided. The methods comprise: loading the substrate onto a substrate support in a vapor deposition reaction chamber, the substrate support positioned in a portion of the reaction chamber configured to receive a generally horizontal flow of reactant gases above the substrate support along a gas flow path; providing an upper bank of substantially linear heat elements above the substrate support, the heat elements of the upper bank being oriented substantially perpendicular to the gas flow path and substantially parallel to an upper surface of the substrate on the substrate support; providing a lower bank of heat elements below the substrate support; providing power to the upper and lower banks of heat elements to subject the substrate to a bake in a reducing environment for less than 45 seconds; during the bake, maintaining a ratio of power delivered to the upper bank of heat elements to power delivered to the lower bank of heat elements at a value greater than a neutral ratio of power between the upper bank and the lower bank, wherein the neutral ratio of power is defined as a power ratio that is optimized to equalize the substrate temperature and the substrate support temperature; stabilizing the substrate temperature after the bake; and depositing a layer by vapor deposition directly over the semiconductor region after stabilizing the temperature.

In accordance with another embodiment, a system for vapor deposition on a semiconductor substrate is provided. The system includes: a reaction chamber; a reducing agent source connected to feed a gas containing reducing agent into the reaction chamber; one or more reactant sources each connected to feed a reactant gas into the reaction chamber; a substrate support housed within the reaction chamber, wherein the reaction chamber is configured to convey a generally horizontal flow of reactant gases above the substrate support along a gas flow path; an upper bank of substantially linear heat lamps above the substrate support, each lamp of the upper bank being oriented substantially perpendicular to the gas flow path and substantially parallel to a plane in which a substrate resting upon the substrate support would reside; a lower bank of heat lamps below the substrate support; and a computer programmed to control the upper and lower banks of heat lamps, gas flow from the reducing agent source, and the one or more reactant sources to (1) provide power to the upper and lower banks of lamps to subject a substrate resting upon the substrate support to a bake in the presence of said gas containing the reducing agent for less than 45 seconds, (2) stabilize the substrate temperature after the bake, and (3) feed said one or more reactant gases into the reaction chamber to deposit a layer by vapor deposition directly onto the substrate after stabilizing the temperature.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other aspects of the invention will be readily apparent to the skilled artisan from the following description and the attached drawings, wherein.

DETAILED DESCRIPTION OF THE PREFERRED EMBODIMENT

Figure 1:
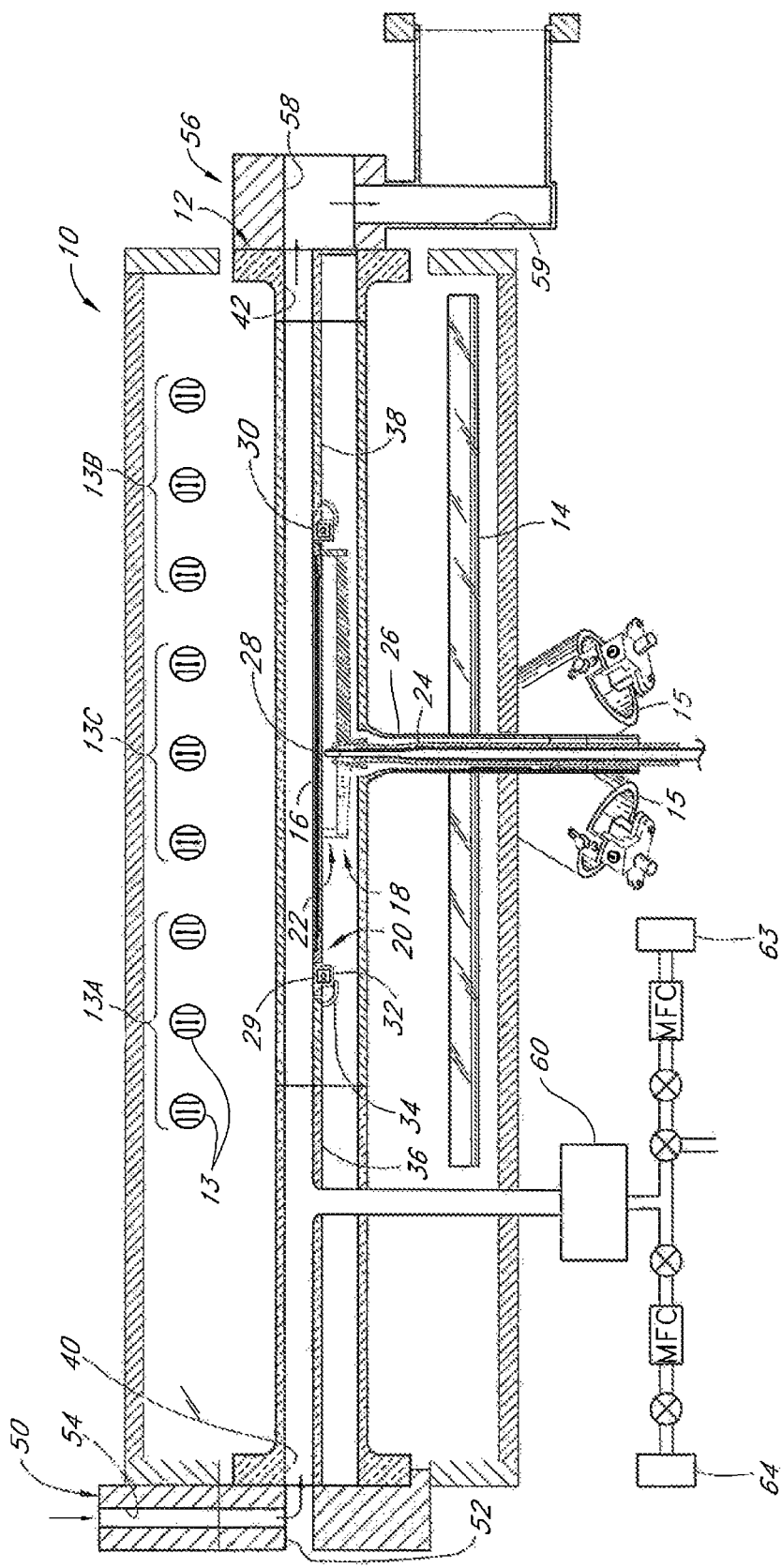
FIG. 1 is a schematic sectional view of a single-substrate reaction chamber in accordance with one embodiment.

While the preferred embodiments of the present invention are discussed in the context of a single-substrate reaction chamber, the skilled artisan will appreciate that the principles and advantages taught herein will have application to deposition reactors of other types. Furthermore, while a series of process steps are disclosed herein, one of ordinary skill in the art will recognize the utility of certain of the disclosed steps even in the absence of some of the other disclosed steps.

As discussed in the background section, one method known in the art for low temperature rapid baking to remove impurities from a substrate surface involves supplying greater power to an upper bank of heat lamps relative to a lower bank of heat lamps. However, this method can result in large temperature variations (e.g., as much as 50-60° C.) on the substrate surface during the bake step. The large temperature variations can cause problems with the quality of the processed substrate, such as crystallographic slip, lattice mismatches, and substrate curling. These problems can adversely affect the performance of devices formed from the processed substrate. Temperature uniformity is also important during other substrate processing steps. For example, temperature uniformity on the substrate during chemical vapor deposition (CVD) is important in order to deposit a thin film with a relatively even thickness. Therefore a need exists for methods of low temperature rapid baking with improved substrate temperature uniformity during bake and processing steps.

In the aforementioned method, the upper heat lamps were oriented parallel to the gas flow direction through the reaction chamber, and the lower lamps were oriented perpendicular to the gas flow direction. It is believed that that arrangement contributes significantly to the large temperature variations across the substrate during the bake step since power delivery from the upper lamps (which, unlike the lower lamps provide direct substrate heating) cannot be modulated or varied along the direction of gas flow in order to compensate for radiation cooling effects believed to be caused by the reactor configuration and/or radiosity. It has been discovered that arranging the upper heat elements perpendicular to the gas flow path can result in improvements in the temperature uniformity of the substrate during processing steps. The heat elements in the upper bank can also be controlled such that more power is provided to the elements adjacent to the leading and trailing edges of the substrate to compensate for temperature variations along the direction of gas flow due to radiation cooling effects and on the leading and trailing edges of the substrate. A lower bank of heat elements can be arranged transversely to the upper bank of heat elements. The increased temperature uniformity during substrate processing can reduce or overcome problems such as crystallographic slip, lattice mismatches, and substrate curling.

A system and methods are provided for low temperature, rapid baking to remove impurities from a semiconductor surface prior to in-situ deposition. Advantageously, a short, low temperature process consumes very little of the thermal budget, such that the process is suitable for advanced, high density circuits with pre-fabricated, shallow junctions and epitaxial SiGe alloys. Also, the preferred reactor configuration can deposit higher quality films because of increased temperature uniformity on the substrate. Furthermore, throughput is greatly improved by a low temperature bake, particularly in combination with low temperature plasma cleaning and low temperature substrate loading prior to the bake, and deposition after the bake at temperatures lower than conventional epitaxial deposition. Although the preferred embodiment for the present invention is illustrated with reference primarily to chemical vapor deposition (CVD), one skilled in the art will understand that atomic layer deposition (ALD), vapor or plasma etch, diffusion, rapid thermal anneal, or any other process requiring uniform thermal control of the substrate would also be suitable.

In a preferred embodiment, a substrate is loaded on a substrate support that has a temperature less than the temperature at which protective termination (e.g., hydrogen) desorbs, such as less than about 500-550° C. for hydrogen terminations left by HF last processes. The hydrogen bake can then be a spike in temperature for less than 30 seconds, 15 seconds in a more preferred embodiment, and the temperature is then quickly stabilized at a temperature suitable for a subsequent in-situ CVD process. For example, selective epitaxy, epitaxial or polycrystalline SiGe, and oxynitride deposition can all be conducted at relatively low temperatures between about 550° C. and 800° C. By reducing the temperature at which the bake and the depositions can take place, a process needs less cooling time between processes, and the throughput of a reaction chamber will consequently be increased. Because the susceptor idles at less than 500° C. between substrates, the chamber can be cleaned with low-temperature plasma.

Preferred Reactor Embodiment

The preferred embodiments are presented in the context of a single-substrate, horizontal flow cold-wall reactor. One type of a substrate is a semiconductor wafer. "Single substrate" processing tools, in general, demonstrate greater process control and uniformity than traditional batch systems, but do so at the expense of throughput, since only one or at best a handful of substrates can be processed at one time. The illustrated single-pass horizontal flow design also preferably enables laminar flow of reactant gases, with low residence times, which in turn facilitates sequential processing while minimizing reactant interaction with each other and with chamber surfaces. Thus, among other advantages, such a laminar flow enables sequentially flowing reactants that might react with each other. Reactions to be avoided include highly exothermic or explosive reactions, and reactions that produce particulate contamination of the chamber. Additionally, the chamber facilitates rapidly purging the chamber between steps, such as purging the chamber of air and moisture after loading a substrate onto the susceptor.

FIG. 1 shows a chemical vapor deposition (CVD) reactor 10, including a quartz process or reaction chamber 12, constructed in accordance with a preferred embodiment, and for which the methods disclosed herein have particular utility. Superior processing control can have utility in many different processing steps, particularly CVD of a number of different materials. Moreover, the illustrated reactor 10 can safely and cleanly accomplish multiple treatment steps sequentially in the same chamber 12. The basic configuration of the reactor 10 is available commercially under the trade name Epsilon® from ASM America, Inc. of Phoenix, Ariz.

A plurality of radiant heat sources 13, 14, 15 are supported outside the chamber 12 to provide heat energy in the chamber 12 without appreciable absorption by the quartz chamber 12 walls. While the preferred embodiments are described in the context of a "cold wall" CVD reactor for processing semiconductor substrates, it will be understood that the processing methods described herein will have utility in conjunction with other heating/cooling systems, such as those employing inductive or resistive heating.

The illustrated radiant heat sources comprise an upper heating assembly or "bank" of elongated, linear tube-type radiant heating elements or lamps 13. The upper heating elements 13 are preferably disposed in spaced-apart parallel relationship and also substantially perpendicular with the reactant gas flow path through the underlying reaction chamber 12, e.g. from inlet port 40 to outlet port 42. A lower heating assembly or bank comprises similar elongated, linear tube-type radiant heating elements or lamps 14 below the reaction chamber 12, preferably oriented transverse to the upper heating elements 13. A portion of the lower heating elements are illustrated in FIG. 1 for simplicity in illustrating the spider 22. Desirably, a portion of the radiant heat is diffusely reflected into the chamber 12 by rough specular reflector plates (not shown) above and below the upper and lower lamps 13, 14, respectively.

Additionally, a plurality of optional spot lamps 15 can supply concentrated heat to the underside of the substrate support structure (described below), to counteract a heat sink effect created by cold support structures extending through the bottom of the reaction chamber 12. Preferably each spot lamp 15 has a power of about 1 kW or greater. Even more preferably, each spot lamp 15 has a power of about 2 kW.

In the illustrated embodiment, elongated tube-type radiant heating elements 13, 14 are preferable because these elements have the desirable properties of being able to heat up and cool down relatively quickly. Preferably, the upper bank of heating elements 13 and lower bank of heating elements 14 can be controlled independently. Also, each heating element 13, 14 is preferably individually controllable with respect to other heating elements. However, as will be apparent to one skilled in the art, in other embodiments alternate heating sources may be used.

The heating elements and reactor can also be configured to compensate for additional heat losses at the edge of the substrate. For example, additional reflectors (not shown) can be placed near the edges of the substrate to reflect additional radiant heat from the heating elements.

Power can also be controlled to individual or groups of the heat elements to provide additional heat to the edges of the substrate. As discussed in greater detail below, the power of the various lamps 13, 14, 15 can be controlled independently or in grouped zones in response to temperature sensors and PID controllers. For example, the edges of the substrate can have additional heat losses because of the increased surface area at the substrate edge and from the heat sink effect from the cold support structures and adjacent areas of the reactor configuration. To counteract the additional heat losses at the edges of the substrate, increased power can be supplied to the upper heat elements 13A, 13B above the edges of the substrate. The same can also be done for the groups of elements 14 at the edge of the substrate, but it may be less effective because the substrate support acts as a thermal capacitor and isolates the substrate from direct absorption/ heating effects.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption.

A substrate 16 is shown supported within the reaction chamber 12 upon a substrate support structure 18. It will be understood that the term "substrate" broadly refers to any surface on which a layer is to be deposited. In some embodiments the substrate preferably comprises a semiconductor wafer, such as a silicon wafer. Moreover, the principles and advantages described herein apply equally well to depositing layers over numerous other types of substrates, including, without limitation, glass substrates such as those employed in flat panel displays.

The illustrated support structure 18 includes a substrate holder 20, upon which the substrate 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

The substrate holder 20 broadly refers to any device capable of holding a substrate. In a preferred embodiment of a cold wall reactor 10, the substrate holder 20 comprises a susceptor that absorbs and emits radiant heat energy. Typical susceptors comprise SiC or SiC-coated graphite, and in the illustrated embodiment the susceptor 20 includes a pocket sized to fit a 200-mm substrate with less than about 1 mm clearance. In other arrangements, the susceptor can be designed (e.g., pocket sized) to support substrates of other sizes, e.g. 300-mm substrates. While certain aspects of the process described herein are compatible with low mass susceptors, some aspects are particularly advantageous for standard susceptors, which are considerably more massive than the substrate for which they are designed to support. Such standard susceptors preferably have a thermal mass greater than about 3 times the thermal mass of the substrate 16 to be supported, and more preferably greater than about 5 times the thermal mass of the substrate, and in the illustrated embodiment the susceptor 20 has a thermal mass about 7-8 times the thermal mass of the substrate 16. A skilled artisan will also appreciate that the certain aspects are also particularly advantageous for other types of susceptors, for example embodiments comprising low thermal mass susceptors with high reflectivity that shield the bottom of the substrate from heat emitted from a lower bank of heat elements.

A plurality of temperature sensors are positioned in proximity to the substrate 16. The temperature sensors can take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the substrate.

In the illustrated embodiment, the temperature sensors comprise thermocouples, including a first or central thermocouple 28, suspended below the substrate holder 20 in any suitable fashion. The illustrated central thermocouple 28 passes through the spider 22 in proximity to the substrate holder 20. The reactor 10 further includes a plurality of secondary or peripheral thermocouples, also in proximity to the substrate 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the substrate 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at substrate edges, a phenomenon which is known to occur due to a greater ratio of surface area to volume in regions near such edges. By minimizing edge losses, the slip ring 32 can reduce the risk of radial temperature non-uniformities across the substrate 16. The slip ring 32 can be suspended by any suitable means. For example, the illustrated slip ring 32 rests upon elbows 34 that depend from a front chamber divider 36 and a rear chamber divider 38. The dividers 36, 38 desirably are formed of quartz. In some arrangements, the downstream divider 38 can be omitted.

The illustrated reaction chamber 12 includes an inlet port 40 for the injection of reactant and carrier gases, and the substrate 16 can also be received there through. An outlet port 42 is on the opposite side of the chamber 12, with the substrate support structure 18 positioned between the inlet 40 and the outlet 42. Typically, the injected reactant and carrier gases flow from the inlet port 40 to the outlet port 42 on the opposing side of the chamber 12.

An inlet component 50 is fitted to the reaction chamber 12, adapted to surround the inlet port 40, and includes a horizontally elongated slot 52 through which the substrate 16 can be inserted. A generally vertical inlet 54 receives gases from remote sources, as will be described more fully below, and communicates such gases with the slot 52 and the inlet port 40. The inlet 54 can include gas injectors as described in U.S. Pat. No. 5,221,556, issued to Hawkins et al., or as described with respect to FIGS. 21-26 in U.S. Pat. No. 6,093,252, issued to Wengert et al. The disclosure of the gas injectors in U.S. Pat. No. 5,221,556 is incorporated by reference herein. The disclosure of the gas injectors as described in FIGS. 21-26 and the related portions of the specification of U.S. Pat. No. 6,093,252 is incorporated by reference herein. Such injectors are designed to maximize uniformity of gas flow for the single-substrate reactor.

An outlet component 56 similarly mounts to the reaction chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

The reactor 10 also preferably includes a generator 60 of excited species, preferably positioned upstream from the chamber 10. The excited species generator 60 of the illustrated embodiment comprises a remote plasma generator, including a magnetron power generator and an applicator along a gas line. An exemplary remote plasma generator has been available commercially under the trade name TR-850 from Rapid Reactive Radicals Technology (R3T) GmbH of Munich, Germany. In the illustrated embodiment, microwave energy from a magnetron is coupled to a flowing gas in an applicator along a gas line. Plasma source gases 63, 64 are located upstream of the excited species generator 60. As is known in the art, the plasma source gases 63, 64 can comprise reactants, carrier gases, gas tanks, bubblers, etc., depending upon the form and volatility of the reactant species. Each gas line can be provided with a separate mass flow controller (MFC) and valves, to allow selection of relative amounts of carrier and reactant species introduced to the excited species generator 60 and thence into the reaction chamber 12. It will be understood that, in other arrangements, the excited species can be generated within the reaction chamber. The preferred processes described below, however, do not employ excited species but are rather species of thermal CVD.

Substrates are preferably passed from a handling chamber (not shown), which is isolated from the surrounding environment, through the slot 52 by a pick-up device. The handling chamber and the processing chamber 12 are preferably separated by a gate valve (not shown) such as a standard vertical slit valve or the types disclosed in U.S. Pat. No. 4,828,224 and U.S. Patent Publication No. 2007-0262296 A1. The disclosure of the gate valves in U.S. Pat. No. 4,828,224 and U.S. Patent Publication No. 2007-022296 A1 are incorporated by reference herein.

The total volume capacity of a single-substrate reaction chamber 12 designed for processing 200 mm substrates, for example, is preferably less than about 30 liters, more preferably less than about 20 liters, and most preferably less than about 10. The illustrated chamber 12 has a capacity of about 7.5 liters. However, because the illustrated chamber 12 is divided by the dividers 32, 38, substrate support 20, and ring 32, the effective volume through which process gases flow is around half the total volume (about 3.77 liters in the illustrated embodiment). Of course, it will be understood that the volume of the single-substrate reaction chamber 12 can be different, depending upon the size of the substrates for which the chamber 12 is designed to accommodate. For example, a single-substrate processing chamber 12 of the illustrated type, but for 300 mm substrates, preferably has a capacity of less than about 100 liters, more preferably less than about 60 liters, and most preferably less than about 30 liters. One 300 mm substrate processing chamber has a total volume of about 24 liters, with an effective processing gas capacity of about 11.83 liters.

Figure 2:
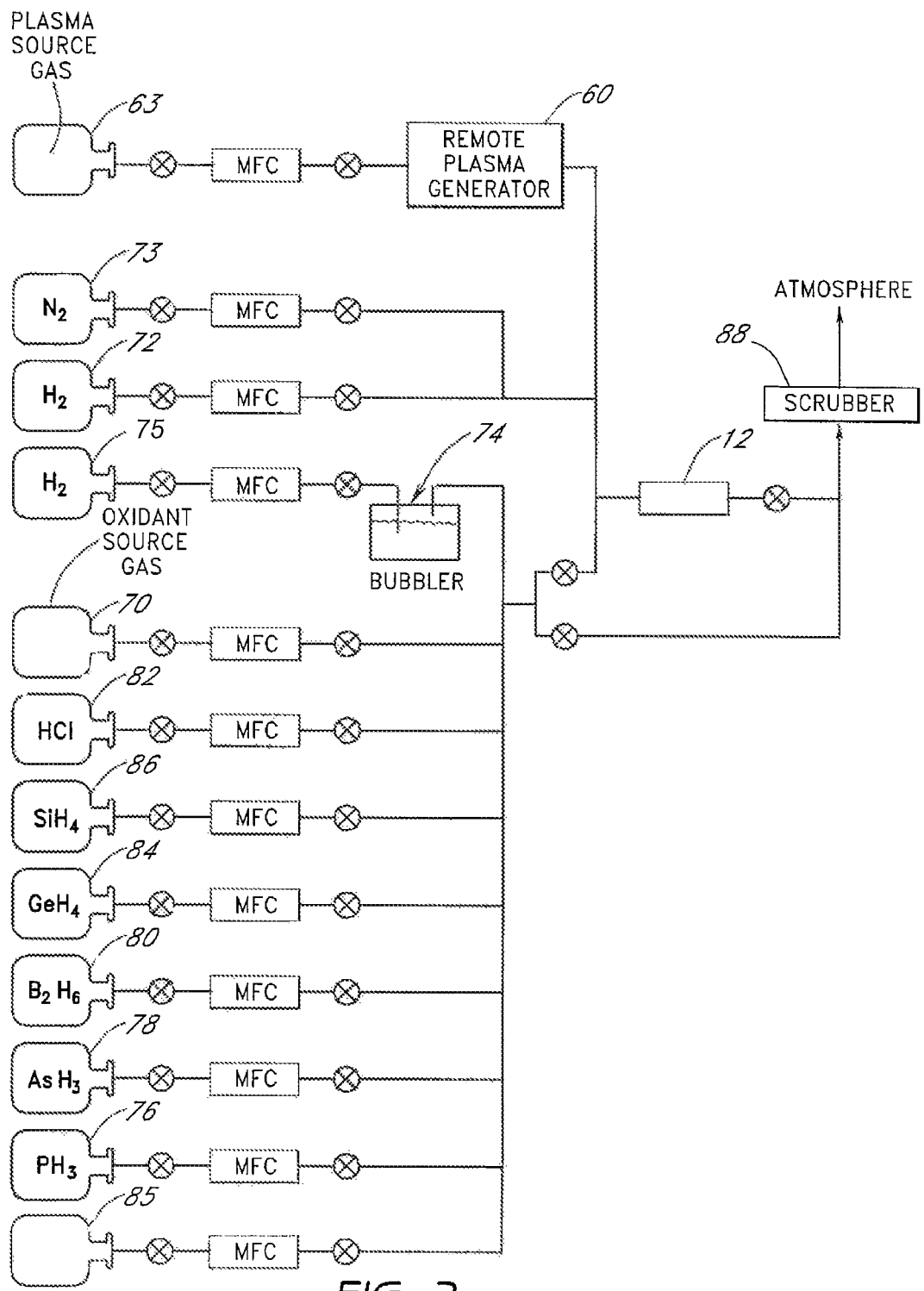
FIG. 2 is a gas flow schematic, illustrating gas sources in accordance with a preferred embodiment of the present invention.

As also shown in FIG. 2, the reactor 10 may further include a source 72 of hydrogen gas ($H_2$). As is known in the art, hydrogen is a useful carrier gas and purge gas because it can be provided in very high purity, due to its low boiling point, and is compatible with silicon deposition. In some embodiments $H_2$ is also employed as a reducing agent in the preferred hydrogen bake prior to layer formation. In other arrangements, $H_2$ can also flow through the excited species generator 60 to generate H radicals for native oxide cleaning or for other purposes.

The reactor 10 may also include a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

An optional liquid reactant source 74 is also illustrated. The liquid source 74 can comprise, for example, liquid dichlorosilane (DCS), trichlorosilane (TCS) or higher order silane sources in a bubbler, and a gas line for bubbling and carrying vapor phase reactants from the bubbler to the reaction chamber 12. The bubbler can alternatively (or additionally) hold liquid $Ta(OC_2H_5)_5$ as a metal source, while a carrier gas source 75 serves to bubble $H_2$ (shown) or other carrier gas through the liquid source 74 and transport metalorganic precursors to the reaction chamber 12 in gaseous form.

Preferably, the reactor 10 also includes other source gases such as dopant sources (e.g., the illustrated phosphine 76, arsine 78 and diborane 80 sources) and etchants for cleaning the reactor walls and other internal components (e.g., a HCl source 82 or a mixture of $NF_3/Cl_2$ provided as the plasma source gas 63 for feeding the excited species generator 60). For deposition of heteroepitaxy films in accordance with the preferred embodiments, a source of germanium 84 (e.g., germane or $GeH_4$) and a source of carbon 85 (e.g., a $SiH(CH_3)_3$, a $Si(CH_3)_4$ source or a $CH_4$ source) is also provided for doping or formation of SiGe and SiC films.

A silane source 86 may also be provided. As is known in the art, silanes, including monosilane ($SiH_4$), DCS and TCS, are common volatile silicon sources for CVD applications, such as the deposition of poly-SiGe, SiC, silicon nitride, metal silicides, and extrinsic or intrinsic silicon (polycrystalline, amorphous or epitaxial, depending upon deposition parameters). Less common sources such as disilane ($Si_2H_6$), trisilane ($Si_3H_8$) and tetrasilane ($Si_4H_{10}$), are also possible. A monosilane ($SiH_4$) source 86 is illustrated.

Additional illustrated source gases include an ammonia ($NH_3$) source 70, which serves as a volatile nitrogen source, useful in CVD and nitridation anneal steps. However, one skilled in the art will understand that the depicted gas sources are merely illustrative, and are not necessary for all embodiments of the claimed invention. Additionally, other gas sources may also be substituted for illustrated gas sources or otherwise added in alternate embodiments.

Each of the gas sources can be connected to the reaction chamber 12 through the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the reaction chamber 12 through injectors. After passing through the reaction chamber 12, unreacted process gases and gaseous reaction by-products are exhausted to a scrubber 88 (FIG. 2) to condense environmentally dangerous fumes before exhausting to the atmosphere.

In addition to the conventional gas sources and liquid bubblers, discussed above, the preferred reactor 10 includes the excited species generator 60 positioned remotely or upstream of the reaction chamber 12. The illustrated generator 60 couples microwave energy to gas flowing in an applicator, where the gas includes reactant precursors from the reactant source 63. For the processes described below, the plasma source gases 63 include a source of fluorine (e.g., $NF_3$, $F_2$ or $B_2F_6$), a source of chlorine (e.g., $Cl_2$) other halide sources and/or a source of carrier gas to help support the plasma (e.g., $N_2$, He or Ar). A plasma is ignited within the applicator, and excited species are carried toward the chamber 12. Preferably, of the excited species generated by the generator 60, overly reactive ionic species substantially recombine prior to entry into the chamber 12. On the other hand, electrically neutral excited species such as F, Cl, N or O largely survive to enter the chamber 12 and react as appropriate. As will be clear from the general process discussion below, remote plasma-generated excited species facilitate low temperature chamber cleaning and attendant high substrate throughput when used in combination with the low temperature bake described herein.

Figure 3:
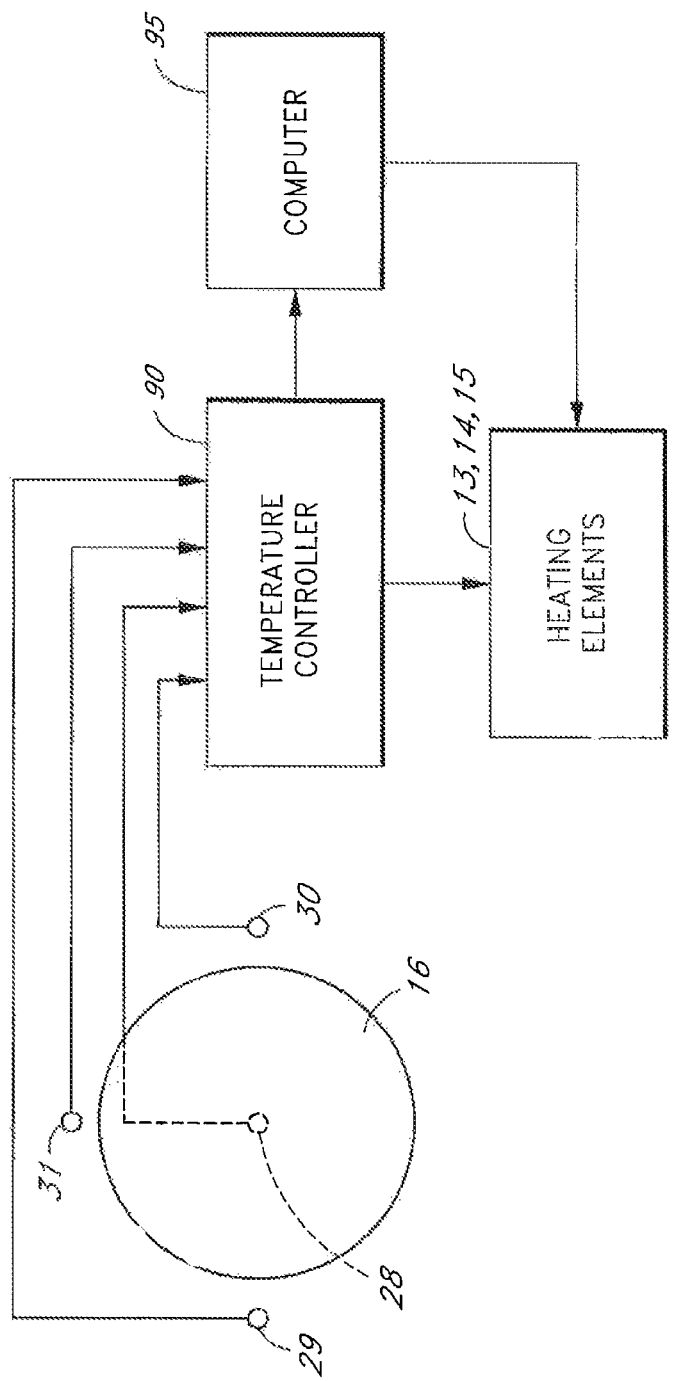
FIG. 3 is a schematic plan view of the substrate in relation to a plurality of temperature sensors and a temperature controller.

With reference to FIG. 3, the substrate 16 is shown in relation to a plurality of temperature sensors, each connected to a temperature controller 90. While illustrated schematically as a single temperature controller 90, the preferred embodiment utilizes four independent temperature controllers for directly controlling the temperatures at four separate temperature sensors. It will be understood by one of skill in this art, however, that the invention can be applied to reactors with any of a number of temperature controllers, such as that disclosed in U.S. Pat. No. 6,207,936 by de Waard et al., entitled "MODEL-BASED PREDICTIVE CONTROL OF THERMAL PROCESSING." The disclosure of the temperature controllers in U.S. Pat. No. 6,207, 936 is incorporated by reference herein. Such a temperature controller can predictively control the temperature of a temperature sensor without being limited by the response time of the sensor.

In some embodiments the temperature controller 90 comprises a programmable computer. In some embodiments the temperature controller 90 can be in communication with a programmable computer 95. In these embodiments the computer can control the power to the heating elements 13, 14, 15.

The preferred temperature controller 90, however, comprises independent PID controllers corresponding to the independent temperature sensors. In the preferred embodiment, the temperature sensors comprise the thermocouples 28-31, which indirectly measure temperature by gauging a voltage across a pair of wires forming a junction, as is known in the art of temperature measurement. The Proportional, Integral, and Differential terms are set for each of the PID controllers by a reactor technician. Such controllers are available from The Foxboro Company of Foxboro, Mass., under the designation 761 CNA Single Station Microcontroller. Furthermore, the upper heating elements 13 and lower heating elements 14, 15 are also independently powered.

Based on the feedback from the heat elements 28-31, the temperature controller 90 can preferably vary the power among the upper heat lamps 13, lower heat lamps 14, and spot lamps 15. Varying the power among the heat lamps can include supplying more power to individual heat elements in comparison to heat elements in the same bank. For example, additional power can be supplied to the heat elements 13 positioned above the outer edges of the substrate 16, e.g. 13A, 13B, in comparison to the heat elements 13 positioned above the center of the substrate 16, e.g. 13C. Preferably, the controller 90 is configured to individually control one, some, or all of the heating elements 13, 14, and 15.

The lower heat elements or lamps 14 are preferably oriented parallel to the substrate 16, and transverse (e.g., perpendicular) to the upper heat elements or lamps 13. Preferably, the lower heat elements 14 are substantially parallel to the direction of reactant gas flow. The transverse orientation of the lower heat elements 14 facilitates "side to side" variation and control of the heat supplied to the substrate 16 and substrate support 20.

In some embodiments, the upper heat elements or lamps and lower heat elements or lamps are both oriented substantially parallel to the direction of reactant gas flow.

The inventors have found that the substantially perpendicular arrangement of the upper lamps 13 with respect to the reactant gas flow path, and the resultant ability to vary the heat profile from the substrate's lead edge to its trailing edge, makes it easier to compensate for cold spots on the substrate, particularly during or after a substrate bake step as described herein. Even though the substrate typically spins during processing, there can be temperature variations along the direction of the gas flow due to cooling of the exposed substrate surface from radiation heat losses caused by radiosity and/or the configuration of the reactor.

In general, the PID controllers can also be programmed to provide additional power to particular groups or zones of heat elements in comparison to other heat elements or groups of heat elements in the same bank. For example, the PID controllers can be programmed to supply greater power to the heat elements 13A above the substrate, in an upstream portion of the reactant gas flow path (or above the leading edge/front thermocouple 29), relative to the power delivered to the heat elements 13C that primarily heat a center of the substrate. The PID controllers can also be programmed to simultaneously supply greater power to the heat elements 13B above the substrate, in a downstream portion of the reactant gas flow path (or above the rear thermocouple 30), in comparison to the power delivered to the heat elements 13C. The additional heat supplied to the edges of the substrate can compensate for the additional heat losses there, thereby producing a more uniform substrate temperature.

The computer and PID controllers can also be programmed to provide additional power to the upper or lower bank of heat lamps, relative to the other bank. For example, during a bake step discussed in greater detail below, power is preferably provided to the upper lamps such that the power is more than about 25% higher, and more preferably about 50% higher than a "neutral" analog ratio of upper lamp power to lower lamp power, where "neutral" refers to a ratio that is optimized to equalize the temperatures of the substrate 16 and substrate support 20. In embodiments where additional power is provided to the upper heat lamps, the power is preferably controlled to individual elements such that the temperature at the surface of the substrate is relatively uniform. The temperature variation between the center of the substrate and edges of the substrate is preferably less than about 5° C., more preferably less than about 2° C., and even more preferably less than about 1° C.

The individual PID controllers and computer can be tuned and adjusted such that the heat provided to the substrate by the upper and lower banks of lamps results in even heating and a relatively uniform temperature across the substrate during and after the bake step described herein. Previous reactors employed upper lamps oriented parallel to the reactant gas flow path, and lower lamps perpendicular thereto. Changing the reactor configuration such that the lamps of the upper bank are aligned substantially perpendicular to the reactant gas flow path resulted in significantly improved temperature uniformity when heating the substrate, greater tuning precision, and decreased time required for tuning the reactor processor and PID controllers. In tuning a reactor configured to receive a 300 mm substrate with the upper heat lamps arranged parallel to the flow of the gas, it was difficult to achieve uniform heating because tuning specific elements or regions of the substrate would often result in uneven heating at other positions on the substrate. In contrast, tuning a reactor configured to receive a 300 mm substrate with the upper heat lamps arranged perpendicular to the flow of the gas is much easier to perform as more straightforward adjustments to the heat lamps can be made to tune the reactor to achieve more uniform heating than was previously possible with the upper heat lamps arranged parallel to the gas flow. Without being bound to a theory, it is believed that radiation cooling effects and radiosity issues are more easily addressed when the upper heat lamps are arranged parallel to the gas flow, e.g., by providing additional power to the upstream and/or downstream upper heat lamps. For example, it is believed that the water cooled injector and exhaust flanges in the 300 mm reactor can soak heat from the upstream and downstream portions of the top side of the substrate.

Polysilicon films are typically deposited on test substrates when tuning the reactor. The deposited polysilicon films are then tested for variations in the thickness of the deposited films. Thicker portions of the deposited film can indicate hotter areas of the substrate while thinner portions of the deposited film can indicate cooler areas of the substrate. The individual PID controllers and computer can then be adjusted to compensate for variations in the thickness of the deposited polysilicon film. After adjusting the PID controllers and computer, a polysilicon film can be deposited on the next test substrate. The process can be repeated until the PID controllers and computer are properly tuned, thereby resulting in uniform temperatures on the substrate during processing steps.

The reactor configuration with the upper lamps arranged perpendicular to the reactant gas flow path typically required a lower number of test substrates than the reactor configuration with the upper lamps arranged parallel to the reactant gas flow path to achieve a desired thickness variation or degree of uniformity for the polysilicon films deposited on the test wafers.

The following reactor tuning numbers are exemplary and subject to variation among different operators and desired tuning results. For example, in the reactor configuration with the upper heat lamps arranged parallel to the reactant gas flow path a minimum thickness variation for the deposited polysilicon films of about 2.5% was typically achieved during tuning. In the reactor configuration with the upper heat lamps arranged perpendicularly to the reactant gas flow path, a minimum thickness variation for the deposited polysilicon films of about 0.8% was typically achieved. Tuning the reactor with the upper heat lamps arranged parallel to the reactant gas flow path typically required a greater number of iterations of test substrates because adjustments to the PID controllers based on the analysis of the prior test substrate would typically cause less predictable hot and cold spots on the subsequent test wafer.

As will be appreciated by the skilled artisan, the reactor 10 preferably includes a computer with a central processing unit and a memory storage device that stores programming information to control the PID controllers 90, as well as the mass flow controllers. Accordingly, the sequence of gate valve opening/closing, robotic substrate transfer, temperature ramping and gas flow described herein are preferably programmed into the computer for a given process "recipe."

Ex-Situ Substrate Cleaning

As noted in the "Background" section above, the purity of a substrate surface can critically affect the quality of a layer deposited thereon, particularly for epitaxially deposited layers. A common source of contamination of semiconductor substrates is native oxide, which naturally forms on naked silicon surfaces upon exposure to the atmosphere. Carbon contaminants also tend to be found at the surface of semiconductor substrates, as received from substrate suppliers.

Such exposure and contamination is inevitable in transporting substrates from vendors to fabrication facilities, and transporting substrates among processing equipment or tools within a facility. For example, polished silicon substrates are typically provided by independent suppliers. Yet another set of suppliers often obtain substrates, apply epitaxial layers, and furnish these substrates to fabrication facilities. Even when epitaxial layers and later fabrication steps are performed at the same facility, substrates are often exposed to atmospheric contaminants and plastic handling equipment between processing steps in different parts of the facility.

Figure 4:
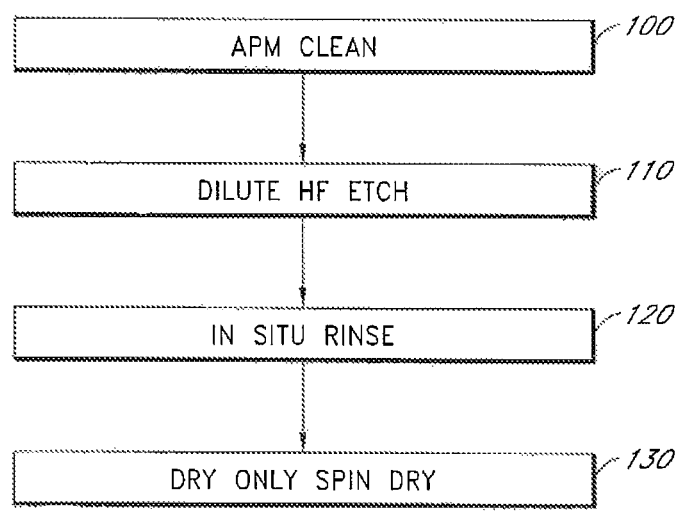
FIG. 4 is a flow chart generally illustrating a preferred method for cleaning a substrate prior to introduction into the reaction chamber.

Accordingly, with reference to FIG. 4, the substrate is most preferably cleaned in an ex-situ bath prior to loading in the CVD reactor. In some arrangements, part or all of the cleaning process of FIG. 4 can be conducted on a process tool clustered around a common transfer chamber with the CVD reactor. The process of FIG. 4 most preferably employs the particularly optimized cleaning process of U.S. Pat. No. 6,620,743 entitled STABLE, OXIDE-FREE SILICON SURFACE PREPARATION, assigned to the assignee of the present application, the disclosure of the cleaning process is incorporated herein by reference. The conditions below are taken from a preferred embodiment of the '743 patent. The skilled artisan will appreciate, however, that the low temperature bake step of the present disclosure can also be employed following other cleaning processes.

Initially, a substrate with a silicon-containing surface (e.g., a bare silicon substrate or a substrate with a SiGe base formed thereon) to be deposited upon is cleaned 100 with an ammonium hydroxide/hydrogen peroxide mixture (APM). The ammonium hydroxide/hydrogen peroxide cleaning 100 of the preferred embodiment uses a solution of 800 mL to 1,000 mL of 30% hydrogen peroxide, 300 mL to 600 mL of 29% ammonium hydroxide and 11 gallons (41 L) of water. Thus, the total bath concentration is preferably 0.50% to 0.80% by volume ammonium hydroxide, and more preferably 0.58% to 0.73% ammonium hydroxide. The total bath concentration is preferably between about 0.10% to 0.50% hydrogen peroxide, and more preferably about 0.21% to 0.42% hydrogen peroxide. The solution is preferably maintained at a temperature of about 20° C. to 50° C., and more preferably 30° C.-40° C. In the preferred embodiment, the substrate is maintained in the solution for about 5 minutes to 15 minutes. The described APM solution of step 100 of FIG. 4 can be similar to the SC-1 solution of the RCA cleaning process.

The APM cleaning step 100 removes particles, surface defects, and Group I and Group II metals from the silicon substrate in the process of growing a chemical oxide. The APM cleaning can be done in an open vessel etch bath or other suitable vessel. Open vessel etch baths are commercially available. The M&A Recirculating Etch Bath, commercially available from Marks & Associates of Phoenix, Ariz., is an exemplary open vessel etch bath which is suitable for use in the APM cleaning step 100. Other open vessel etch baths are suitable for the APM cleaning step 100. Furthermore, the APM cleaning step 100 is not limited to open vessel etch baths.

A dilute hydrofluoric (dHF) acid etch step 110, as shown in FIG. 4, is performed after the APM cleaning step 100. An oxide layer is present on the surface of the silicon substrate after the APM cleaning step 100. The dilute hydrofluoric acid etch step 110 removes the oxide layer from the silicon substrate.

The dilute hydrofluoric acid for the dilute hydrofluoric etch step 110 preferably has a concentration of approximately 0.5% to 1.0% by weight (wt %) hydrogen fluoride, and more preferably 0.5 wt. % HF. Use of a dilute hydrofluoric acid for the etch step 110 minimizes contamination on the surface of the silicon substrate. The dilute hydrofluoric acid is preferably heated to a temperature of about 35° C. to 60° C., and more preferably at about 50° C., to minimize particles and to enhance hydrogen termination on the surface of the silicon substrate. The heated dilute hydrofluoric acid etch also provides for uniform oxide etch rates on the entire surface of the silicon substrate. The silicon substrate is preferably exposed to the dilute hydrofluoric acid etch for a time period of between about 20 seconds and 2 minutes, more preferably for a time period of between about 40 seconds and 60 seconds, and most preferably for a time period of approximately 60 seconds. In an exemplary procedure, the silicon substrate is etched with dilute hydrofluoric acid having a concentration of approximately 0.5 wt % hydrogen fluoride at a temperature of approximately 50° C. for approximately 60 seconds.

Preferably, the substrate is dipped in an aqueous or wet HF bath, although the skilled artisan will appreciate that HF vapor can also be employed in other arrangements. The ultrapure water which is used to form the dilute hydrofluoric acid in the etch bath has high resistivity, indicating that the metals levels are low. The water which is used to form the dilute hydrofluoric acid in the etch bath has a resistivity greater than about 15 megaohms-cm (MΩ-cm) at a temperature of 25° C., and most preferably a resistivity of at least about 18 MΩ-cm. The total organic carbon (TOC) and the dissolved silica are also preferably minimized to levels of less than 10 ppb (parts per billion).

The hydrofluoric acid which is used to form the dilute hydrofluoric acid in the etch bath is preferably gigabit grade (on the order of parts per trillion impurities) hydrofluoric acid with low levels of particles and dissolved metals, commercially available as Part No. 107101 in a 49% solution from Alameda Chemical of Chandler, Ariz., (480) 505-5330.

In the preferred embodiments, a high purity nitrogen purge curtain is employed at the air/liquid interface during both the dilute hydrofluoric acid etch step 110 and the subsequent in-situ rinse step 120. The high purity nitrogen is filtered through a filter, which removes particles larger than 0.003 µm at the point of use. Ionizing the nitrogen before the nitrogen contacts the silicon substrate minimizes particles. An ionizer, for example, is part of the Verteq SRD™ system. The high purity nitrogen enhances particle neutrality and stable surface termination on the silicon substrate.

After the silicon substrate is etched with dilute hydrofluoric acid in step 110, the silicon substrate is rinsed in-situ in the etch bath with ultrapure water for maximum hydrogen passivation of the etched silicon surface in the in-situ rinse step 120 of FIG. 4. The ultrapure water which is used for the in-situ rinse step 120 desirably has the same purity as the ultrapure water which is used to form the dilute hydrofluoric acid in the etch bath to maintain stable hydrogen termination and particle neutrality. The etched silicon substrate is preferably rinsed with ultrapure water for a time period sufficient to remove all HF acid and particles from the previous etch step, which of course depends upon the volume of the etch bath.

Rinsing the silicon substrate in-situ in the etch bath minimizes the amount of contamination. Furthermore, the in-situ rinse step 120 eliminates a step of transferring the substrate into a rinse bath. Contamination of the silicon substrate could occur during the transfer to the rinse bath. In the illustrated embodiment, the in-situ rinse step 120 is conducted at approximately room temperature (typically 20° C.-25° C., or about 23° C.). The in-situ rinse is preferably a cascade and displacement rinse. An exemplary in-situ rinse step 120 involves an in-situ rinse in the etch bath with ultrapure water at room temperature for approximately 15 minutes.

After the silicon substrate is rinsed with ultrapure water, it is dried in the spin-dry step 130 of FIG. 4. Although a variety of spin-drying apparatuses are suitable for the drying step 130, the Verteq 1800 is an exemplary spin/rinse dryer, commercially available from Verteq, Inc. of Santa Ana, Calif. The silicon substrate is transferred to the spin/rinse dryer after rinsing in the in-situ rinse step 120. In the spin-only dry step 130, the silicon substrates are spun dry while hot, ionized nitrogen is flowed into the dryer at a rate of between about 15 slm and 25 slm. The hot nitrogen gas is preferably at a temperature of 60° C. to 80° C., more preferably at a temperature of 65° C. to 75° C., and most preferably at a temperature of about 70° C. Only the dry cycle is carried out, preferably at 400 rpm to 600 rpm, without using the rinse cycle of the machine. The nitrogen stream is passed through a filter, which removes particles larger than 0.003 µm before entering the dryer. The dry only spin-dry step 130 is carried out until the silicon substrates are dry, typically approximately 240 seconds for bare silicon substrates and approximately 480 seconds for patterned substrates. The dry only spin-dry step 130 enhances particle neutrality and stable surface termination on the silicon substrate.

An exemplary dry only spin-dry step 130 is conducted at 500 rpm for 240 seconds for a bare silicon substrate or 480 seconds for a patterned silicon substrate with the heater on and antistatic option (ionization) on.

Advantageously, the process described herein produces a low particulate count and a hydrogen termination that can remain stable under clean room conditions for days, in contrast to conventional cleaning processes that result in oxidation within about 20 minutes. Conventional cleaning can, however, be used in conjunction with the processes described below; in this case it is preferred to conduct such cleaning, or at least the HF last treatment, immediately prior to initiating the process of FIG. 5.

Low Temperature Bake, Deposition and Chamber Cleaning

Figure 5:
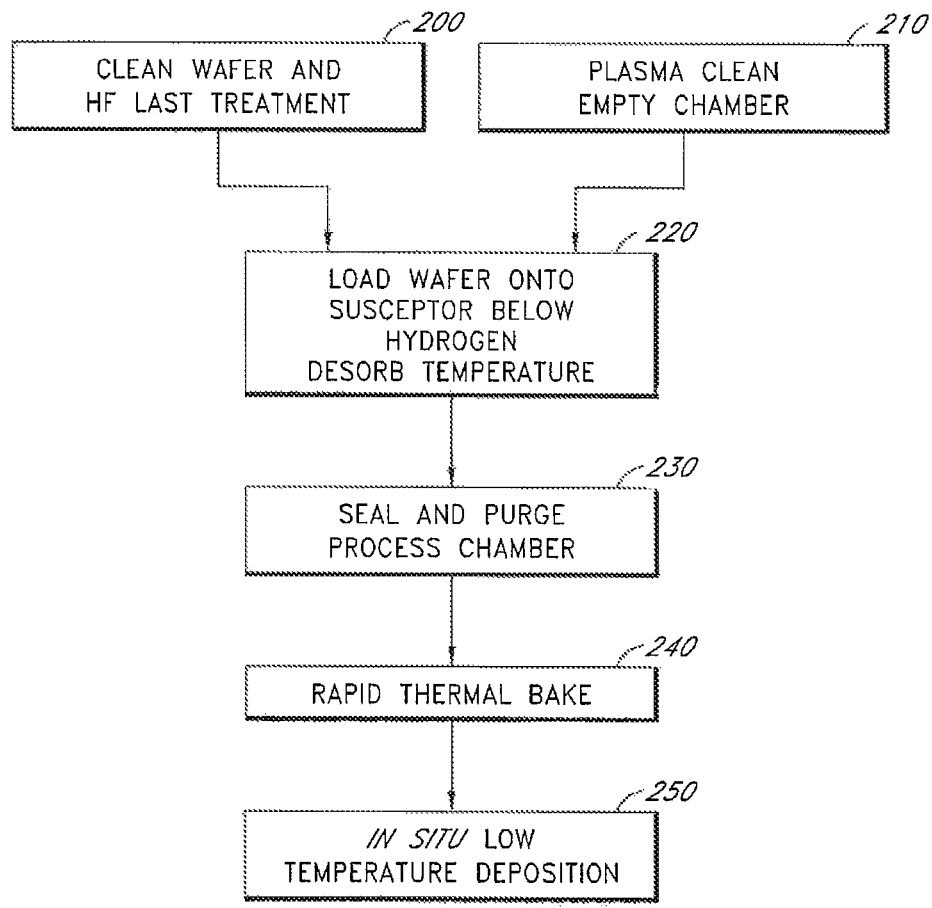
FIG. 5 is a flow chart generally showing a process in accordance with the preferred embodiments.

Referring now to FIG. 5, the process of FIG. 4 is illustrated as a step 200 and occurs prior to loading 220 substrates in the preferred CVD chamber.

Residue from silicon source gases is generally left on surfaces of the reaction chamber 12 (FIG. 1) after the deposition. In the past, such residues have been removed with simple HCl vapor etch steps between depositions. Without frequent cleaning, the residue can cloud the quartz reactor walls through which radiant heat must pass for normal operation. Exposing the residue to an oxidation step before the etch step, however, tends to harden the residue, requiring more harmful or costly cleaning steps. Ex-situ acid washing the coated surfaces, for example, entails considerable costs in dismantling the reaction chamber, not to mention the costs of reactor down time during ex-situ cleaning of reactor components.

As will be appreciated from the discussion below, the low temperature loading 220 of substrates and low temperature bake step 240 permit taking full advantage of the low temperatures afforded by plasma energy during the chamber clean 210. Without the low temperature loading process 220, which is facilitated by the subsequent low temperature bake 240, the chamber temperature would at any rate need to be ramped up to a higher bake temperature.

After the plasma chamber clean 210, the substrate is loaded 220 into the reaction chamber and onto the substrate support or substrate holder 20 (FIG. 1). In the preferred embodiment, the substrate support holder 20 comprises a susceptor and "idles" between substrate processing at less than the temperature at which the protective termination on the substrate desorbs. For example, following an HF last process that leaves a hydrogen termination, the susceptor 20 idles at less than 550° C., preferably less than about 500° C., and in a preferred embodiment at about 450° C. Accordingly, the susceptor 20 is maintained at the temperature of the preceding plasma clean 210 during loading 220 in the illustrated embodiment.

Advantageously, the low temperature loading 220 largely maintains the hydrogen termination on the substrate surface until after the chamber gate valve is closed and chamber purging 230 begins to remove any atmospheric contaminants which can have been introduced through the gate valve during loading of the substrate. Purging can be performed with any suitable purge gas, but is most preferably conducted with hydrogen gas. Desirably, $H_2$ is flowed from the inlet port 40 to the outlet port 42, as well as through the depending tube 26 to the underside of the substrate holder 20 (see FIG. 1). Preferably, $H_2$ flow rates are within about 10-100 slm.

Due to the low substrate temperature at this stage, air and moisture are removed from the chamber before substantial loss of the hydrogen termination, and minimal oxidation of the substrate surface occurs. Additionally, the low temperature loading 220 reduces damage to substrates, substrate handling robot end effectors and susceptors by reducing the advent of substrate "curl." Substrate curl is a well-known phenomenon resulting from thermal shock of bringing a relatively cold substrate into sudden contact with a much hotter substrate support. Moreover, in combination with the low temperature plasma clean 210 and low temperature bake 240 (discussed below), low temperature loading can significantly improve substrate throughput.

After purging 230, the low temperature bake 240 is conducted. Having maintained the protective termination until purging 230 the chamber, relatively little contamination needs to be removed, such that the bake step need not be as high in temperature or as prolonged as conventional bake steps. Furthermore, extremely rapid temperature ramping can be conducted without fear of exacerbating the native oxide problem, since the chamber is largely free of oxygen and moisture at the time of ramping. Accordingly, the low temperature bake 240 preferably involves quickly ramping the substrate temperature for less than about 45 seconds, more preferably less than about 30 seconds, most preferably for less than about 20 seconds, and in some cases less than 10 seconds. In a preferred embodiment, wherein a 200-mm substrate is employed, temperature ramping proceeds for only about 15 seconds before stabilizing the temperature for the subsequent deposition. In another preferred embodiment, wherein a 300-mm substrate is employed, the temperature ramping proceeds for only about 30 seconds before stabilizing the temperature for a subsequent deposition. In another preferred embodiment, wherein a 300-mm substrate is employed, the temperature ramping proceeds for only about 20 seconds or less before stabilizing the temperature for a subsequent deposition. The skilled artisan will readily appreciate, in view of the disclosure herein, that the temperature ramping time can be adjusted for different substrate sizes and lamp power.

Advantageously, this low temperature bake 240 leaves very low levels of oxygen and carbon contamination at the surface. Experiments using the SIMS analytical technique indicate less than $10^{18}$ atoms/cm$^3$ of oxygen at the interface between the silicon surface and subsequently deposited layer. These results are achieved with very low consumption of thermal budget (low temperatures and time), desirably without adding halide etch species to the bake process. If desired, in some arrangements, metal impurities can also be removed if HCl is added to the low temperature bake process 240.

As illustrated, the low temperature bake 240 is preferably followed in-situ by a low temperature deposition 250, which are both discussed in more detail below. "Low temperature," as used to describe the deposition 250, refers to processes conducted at below conventional epitaxial silicon deposition temperatures. Accordingly, the substrate does not need to be heated further after the bake step and typically the temperature needs to be lowered.

Accordingly, to maximize throughput under such conditions, the low temperature bake 240 is conducted in a manner that minimizes the time to stabilize at the temperature desired for the deposition 250. Accordingly, the rapid temperature ramp is conducted by providing biased power to the upper lamps 13 (see FIG. 1), relative to the power provided to the lower lamps 14 (FIG. 1). For example, in one embodiment of a bake 240, the power provided to the upper lamps is preferably more than about 25% higher, and more preferably about 50% higher than a "neutral" analog ratio of upper lamp power to lower lamp power, where "neutral" refers to the ratio optimized to achieve equal substrate 16 and susceptor 20 temperatures. In one embodiment, the upper lamps 13 may be at full power at an analog ratio of 50% above neutral for a temperature ramp in a reactor 10. In some embodiments full power can be supplied to the upper lamps during the bake step. Thus, the substrate is rapidly heated during the low temperature bake 240, but the more massive susceptor 20 does not heat as rapidly and therefore does not require much time to drop in temperature and then stabilize at the deposition temperature.

The power provided to the upper and lower lamps during the bake and other substrate processing steps can be individually controlled to each heat element. For example, the power provided to the upper lamps can be preferentially delivered to the lamps along the outer edge of the substrates relative to evenly splitting the power between all of the lamps in the upper bank. The power can also be preferentially delivered to groups of heat elements, for example, additional power can be provided to groups 13A and 13B relative to group 13C. The specific amount of power delivered to each heat element in the upper bank of lamps can vary depending on the particular reactor configuration and location of cold sinks in the reactor and how the PID controllers are tuned. As discussed above, the PID controllers and reactor processor can be tuned such that the temperature across the surface of the substrate is relatively uniform during the bake and processing steps. The temperature difference between the center of the substrate and the edges of the substrate is preferably less than about 5° C., more preferably less than about 2° C., and more preferably less than about 1° C. In configurations with the upper heat elements parallel to the reactant gas flow path a temperature variation of about 50° C. has been observed in some bake steps. High temperature variations across the substrate can cause undesirable defects in the substrate and produce lower quality films.

As noted, the deposition 250 is conducted at lower than standard epitaxial silicon processes. Preferably the substrate temperature is between about 450° C. and 950° C., more preferably between about 550° C. and 800° C., and most preferably between about 600° C. and 700° C. Due in part to the low maximum temperature and rapidity of the bake 240, temperatures preferably stabilize at the desired deposition temperature in less than 1 minute after the temperature ramp, preferably less than about 45 seconds after the bake 240. In one embodiment temperature stability at 650° C. is reached in 45 seconds, including the bake step 240. In contrast, lowering the temperature for this system from a traditional bake temperature of 900° C. to 650° C. ordinarily takes about 2 minutes, not including the bake time.

Low temperature deposition 250 on the clean silicon surface can be one of a number of possible processes. For example, selective epitaxial silicon deposition is conducted between about 550° C. and 800° C. Such a process is of particular utility for circuit designs calling for elevated source/drain regions or elevated emitters. The skilled artisan will readily appreciate precursors and conditions suitable for such post-bake low temperature deposition processes.

Following the deposition 250, the temperature of the substrate 16 and susceptor 20 is allowed to fall to idling temperature while the gate valve is opened, the substrate 16 is removed, the gate valve is closed, and plasma chamber cleaning 210 is again commenced. The processed substrate can undergo additional processing steps depending on the desired structure. Alternatively, another substrate is then introduced and loaded 220 onto the susceptor 20 at a low temperature, and the process is repeated.

In a preferred embodiment, a recipe is entered into the processor of the reactor 10 and temperature controllers (not illustrated) are programmed with target temperature goals with which to determine heating element power allocation. As an example of the previous description, the following recipe is provided for conducting a low temperature bake: First, a plasma chamber clean is conducted. Second, the substrate 16 is loaded into the reaction chamber 12 and onto the substrate support or susceptor 20 while hydrogen is supplied to the chamber at 10 slm and with the temperature controller set at 350° C. Third, the chamber 12 is sealed and hydrogen gas is supplied to the reaction chamber at 20 slm while the temperature controller is set to 450° C. Fourth, the chamber 12 is pumped down to 0.8 atmospheres. Fifth, the temperature controllers are set to 1100° C., corresponding with about full power being sent to the heating elements, and a bake is conducted for 15 seconds. Even when full power is sent to the heating elements, the power can be individually controlled to each heating element, such that some heating elements receive more power than other elements. It is important to note that, while the temperature controllers are seeking to achieve 1100° C., neither the chamber temperature, nor the substrate ever actually approach that temperature, generally staying in the 700° C. to 900° C. range. Further, the top surface of the substrate typically reaches higher temperatures than the bottom of the substrate during the bake step or other processing step comprising providing biased power to the upper lamps. Also, as discussed above, when biased power is supplied to the upper lamps the power can be individually controlled to each heat element such that the temperature across the substrate surface is relatively uniform. Sixth, a backfill step is conducted while the temperature controllers are set to 680° C., hydrogen flow is increased to 45 slm, and pressure is increased to 1 atmosphere. Thereafter, deposition takes place, as described above.

Advantages of Low Temperature Bake

The processes described herein enable a low temperature and rapid hydrogen bake while still providing very clean silicon surfaces for subsequent deposition. Accordingly, shallow junctions can maintain their integrity. The low temperature bake and short substrate temperature spike can be advantageous when processing substrates where the thermal budget can be a concern, e.g., SiGe layers, transistors, substrates with sensitive structures, etc. Furthermore, the combination of the described low temperature bake with relatively low temperature deposition, conducted in-situ, allows for considerable improvements in substrate throughput, lowering overall costs of operation. Low temperature plasma chamber cleaning, in combination with the above, provides even further benefits to throughput, while still maintaining the purity desired of state-of-the-art semiconductor fabrication.

Advantages During Reactor Tuning

As discussed above, the reactor configuration described herein can be more precisely and quickly tuned than the previous configuration. For example, the reactor configuration with the upper lamps arranged perpendicular to the reactant gas flow path required a lower number of test substrates than the reactor configuration with the upper lamps arranged parallel to the reactant gas flow path to achieve a desired thickness variation or degree of uniformity for the polysilicon films deposited on the test wafers. The increased tuning precision can also decrease the amount of time spent tuning the reactor and PID controllers.

Advantages of Aligning Upper Lamps Perpendicular to Reactant Flow Path

The reactor configuration and processes disclosed herein provide additional benefits for low temperature processing. Orienting the upper lamps perpendicular to the reactant gas flow path improves the ability to achieve a more uniform temperature across the substrate during processing steps. The improved temperature uniformity results in formation of a film with a lower surface roughness.

Temperature uniformity can also avoid damage to the substrate. Uneven heating and larger temperature gradients across the substrate can cause defects in the substrate, such as crystallographic slip, substrate curling, and crystal lattice mismatch. These defects can affect the reliability and performance of the electronic devices incorporating these structures. Decreasing the frequency of defects in the substrate can result in the deposition of higher quality films and structures on the substrate surface, thereby producing more reliable electronic devices.

It will be appreciated by those skilled in the art that various modifications and changes can be made without departing from the scope of the invention. Similar other modifications and changes are intended to fall within the scope of the invention, as defined by the appended claims.

We claim:

1. A system for vapor deposition on a semiconductor substrate, comprising:
    a reaction chamber;
    a reducing agent source connected to feed a gas containing reducing agent into the reaction chamber;
    one or more reactant sources each connected to feed a reactant gas into the reaction chamber;
    a substrate support housed within the reaction chamber, wherein the reaction chamber is configured to convey a generally horizontal flow of reactant gases above the substrate support along a gas flow path;
    an upper bank of substantially linear heat lamps above the substrate support, each lamp of the upper bank being oriented substantially perpendicular to the gas flow path and substantially parallel to a plane in which a substrate resting upon the substrate support would reside;
    a lower bank of heat lamps below the substrate support; and
    a computer programmed to control the upper and lower banks of heat lamps, gas flow from the reducing agent source, and the one or more reactant sources to (1) provide power to the upper and lower banks of lamps to subject a substrate resting upon the substrate support to a bake in the presence of said gas containing the reducing agent for less than 45 seconds, (2) stabilize the substrate temperature after the bake, and (3) feed said one or more reactant gases into the reaction chamber to deposit a layer by vapor deposition directly onto the substrate after stabilizing the temperature.

2. The system of claim 1, further comprising a robot configured to transfer a substrate into and out of the reaction chamber.

3. The system of claim 1, wherein the heat lamps of the lower bank are substantially linear and oriented substantially perpendicular to the heat lamps of the upper bank, and substantially parallel to the upper surface of the substrate on the substrate support.

4. The system of claim 1, wherein the substrate support comprises a susceptor.

5. The system of claim 1, wherein the computer is programmed to maintain a ratio of power delivered to the upper bank of lamps to power delivered to the lower bank of lamps at a value greater than a neutral ratio of power between the upper bank and the lower bank during the bake, wherein the neutral ratio of power is defined as a power ratio that is optimized to equalize the substrate temperature and the substrate support temperature.

6. The system of claim 5, wherein the programmed ratio of power is greater than 25% higher than the neutral ratio.

7. The system of claim 1, wherein the computer is programmed to maintain the substrate at a uniform temperature during the bake and deposition.

8. The system of claim 1, wherein the computer is programmed to deliver more power to one or more of the upper bank's heat lamps positioned in an upstream portion of the gas flow path, relative to power delivered to lamps of the upper bank that primarily heat a center of the substrate, the computer also programmed to simultaneously deliver more power to one or more of the upper bank's heat lamps positioned in a downstream portion of the gas flow path, relative to the power delivered to the lamps that primarily heat a center of the substrate.

9. The system of claim 1, wherein the computer is programmed to raise the substrate temperature from below 500° C. to greater than 500° C. after loading the substrate onto the substrate support.

10. The system of claim 1, wherein the computer is programmed to deliver power non-uniformly to the heat lamps of the upper bank such that the temperature at an edge of the substrate is within 5° C. of the temperature at a center of the substrate during the bake.

11. The system of claim 1, wherein stabilizing the substrate temperature comprises lowering the substrate temperature to a temperature suitable for vapor deposition within about 30 seconds after the bake.

12. The system of claim 1, wherein the computer is programmed to provide power to the upper and lower banks of lamps to subject a substrate resting upon the substrate support to a bake in the presence of said gas containing the reducing agent for less than about 30 seconds.

13. A system for vapor deposition on a semiconductor substrate, comprising:
    a reaction chamber configured to support a substrate and flow reaction vapors parallel to a major surface of the substrate along a gas flow path;
    a reducing vapor source connected to the reaction chamber;
    one or more deposition vapor sources each connected to the reaction chamber;
    an upper bank of substantially linear heat lamps above the substrate, each lamp of the upper bank being oriented substantially perpendicular to the gas flow path and substantially parallel to the major surface of the substrate;
    a lower bank of heat lamps below the substrate; and
    a computer programmed to control the upper and lower banks of heat lamps, reducing vapor flow from the reducing vapor source through the reaction chamber, and deposition vapor flow from the one or more deposition vapor sources through the reaction chamber to (1) provide power to the upper and lower banks of lamps to subject the substrate to a bake while exposed to the reducing vapor flow for less than 45 seconds, and (2) deposit a layer by vapor deposition directly onto the substrate while exposed to the deposition vapor flow after the bake for less than 45 seconds.

14. The system of claim 13, further comprising a substrate support within the reaction chamber to support the substrate from below, wherein the computer is programmed to maintain a ratio of power delivered to the upper bank of lamps to power delivered to the lower bank of lamps at a value greater than a neutral ratio of power between the upper bank and the lower bank during the bake, wherein the neutral ratio of power is defined as a power ratio that is optimized to equalize a substrate temperature and a substrate support temperature.

15. The system of claim 13, wherein the computer is programmed to deliver more power to one or more of the upper bank's heat lamps positioned in an upstream portion of the gas flow path, relative to power delivered to lamps of the upper bank that primarily heat a center of the substrate, the computer also programmed to simultaneously deliver more power to one or more of the upper bank's heat lamps positioned in a downstream portion of the gas flow path, relative to the power delivered to the lamps that primarily heat a center of substrate center.

16. The system of claim 13, wherein the computer is further programmed to stabilize a substrate temperature prior to depositing the layer by lowering a substrate temperature to a temperature suitable for vapor deposition within about 30 seconds after the bake.

* * * * *